United States Patent [19]

Early et al.

[11] Patent Number: 4,943,807
[45] Date of Patent: Jul. 24, 1990

[54] DIGITALLY CALIBRATED DELTA-SIGMA ANALOG-TO-DIGITAL CONVERTER

[75] Inventors: Adrian B. Early, Buda; Larry L. Harris; Michael J. Callahan, Jr., both of Austin, all of Tex.

[73] Assignee: Crystal Semiconductor, Austin, Tex.

[21] Appl. No.: 180,889

[22] Filed: Apr. 13, 1988

[51] Int. Cl.$^5$ ............................................. H03M 1/10
[52] U.S. Cl. ..................................... 341/120; 341/143
[58] Field of Search ............... 341/118, 120, 131, 139, 341/140, 141, 143, 155

[56] References Cited

U.S. PATENT DOCUMENTS

| | | | |
|---|---|---|---|
| 3,725,903 | 3/1973 | Kosakowski | 341/120 |
| 4,186,384 | 1/1980 | Acker | 341/143 |
| 4,338,589 | 7/1982 | Engel et al. | 341/120 |
| 4,364,027 | 12/1982 | Murooka | 341/120 |
| 4,509,037 | 4/1985 | Harris | 341/143 |
| 4,588,979 | 5/1986 | Adams | 341/131 |
| 4,674,062 | 6/1987 | Premerlani | 341/118 |
| 4,796,004 | 1/1989 | Rich et al. | 341/143 |

*Primary Examiner*—William M. Shoop, Jr.
*Assistant Examiner*—Howard L. Williams
*Attorney, Agent, or Firm*—Gregory M. Howison

[57] ABSTRACT

A self-calibrated analog-to-digital converter with a corrected output includes an analog modulator (18) for receiving an analog input voltage and outputting a pulse train having a value proportional to the analog input voltage. The pulse train is filtered by a digital filter (20) which has the output thereof input to a calibration module (24). The calibration module (24) is controlled by a calibration control circuit (28) and is operable to correct the output to account for offset and gain errors. Prestored calibration parameters in a register (30) are utilized for this compensation. In a self-calibration mode, the control circuit (28) is operable to control a calibration multiplexer (12) to select a zero-scale input voltage on a terminal (16) and a full-scale reference voltage on a terminal (14) for input to the modulator (18). The multiplexer (12) is controlled to selcet the zero-scale reference to calculate an offset value for storage in the register (30) and then subsequently select the full-scale reference to calculate a scale factor for storage in the register (30). The self-calibration mode utilizes a settling counter (36) to insure that the output of the filter (20) has settled prior to making any calculations.

34 Claims, 2 Drawing Sheets

DIGITALLY CALIBRATED DELTA-SIGMA ANALOG-TO-DIGITAL CONVERTER

TECHNICAL FIELD OF THE INVENTION

The present invention pertains in general to analog-to-digital converters, and more particularly, to an analog-to-digital converter with digital calibration on the output thereof.

BACKGROUND OF THE INVENTION

Analog-to-digital converters have seen increased use in recent years due to the advances in digital signal processing and the increased use of digital transmission systems. Typically, analog-to-digital converters comprise circuitry for receiving an analog input signal and outputting a digital value that is proportional to the input analog signal. This digital output value can either be a parallel word or a serial digital bit string. There are many types of analog-to-digital conversion schemes such as voltage to frequency converters, charge redistribution, delta modulation, etc. Each of these techniques has advantages and disadvantages associated therewith.

One type of analog-to-digital converter that has seen increased use in recent years is that utilizing delta-sigma modulation wherein an analog voltage is input to a delta-sigma modulator and the output thereof filtered to remove the noise. The delta-sigma modulator is of the type which converts an analog input to a digital pulse string having an average amplitude over time proportional to the analog input. One type of delta-sigma pulse modulator is described in U.S. Pat. No. 4,542,354, issued Sept. 17, 1985 to Robinton, et. al. Delta-sigma modulation provides for high accuracy and wide dynamic range, as compared to the earlier delta modulation techniques. The delta-sigma type modulation is sometimes referred to as an oversampled converter architecture which is immune from some of the earlier undesirable second order effects of delta modulation.

There are two key components of a delta-sigma analog-to-digital converter, the analog modulator and the digital filter. The analog modulator oversamples the analog input and produces a low-resolution digital output. However, with any A/D converter, there are a number of noise sources that are inherent to any analog modulator design. In a delta-sigma modulator, there are output stage noises and input noises, the output noise sources normally being dominated by quantization noise. Quantization noise at low frequencies is relatively low and the higher frequency noise can be filtered out by a digital domain low pass filter. However, the modulation itself can be designed to provide some complex noise shaping. For example, a second order delta-sigma modulator provides two poles as opposed to the single pole of the first order, single integrator loop, the second order loops providing improved noise shaping over first order loops.

The digital filtering of the analog output is typically provided by a digital signal processor. As digital signal processors are best suited to handle digital data at much lower rates than the output samples from the modulator, the converter output rate is typically reduced by a process called decimation. Decimation is a process of digitally converting the sampling rate of the signal from a given rate to a lower rate. Typically, this decimation process is operable to remove the large amounts of high frequency quantization noise that typically are output by a delta-sigma modulator. This effectively provides the analog-to-digital converter bandwidth and allows only a tiny amount of the analog modulator's quantization noise to get through.

As a result of the various error sources and dc drift problems inherent in the analog modulator, the output of the modulator can have an offset error and a gain error. This error must be accounted for in wide dynamic range applications. Typically, some type of offset correction through the use of feedback provides the offset correction, and a gain adjustment of some type is provided for the output of the analog modulator. These typically can be quite expensive to implement in a manufacturing environment since they may require adjustment of capacitor values, etc. One type of offset correction is illustrated in Robinton, U.S. Pat. No. 4,542,354. However, this compensation is done at the modulator.

SUMMARY OF THE INVENTION

The present invention disclosed and claimed herein comprises a self-calibrating analog-to-digital converter. The converter comprises an analog-to-digital conversion circuit for receiving an analog input signal and converting it to a digital output that has a value proportional to the analog input. Digital calibration parameters are stored in a memory and the output is compensated in accordance with a predetermined compensation algorithm as a function of the digital calibration parameters. Self-calibration circuitry is provided for the analog-to-digital converter to generate and store the calibration parameters. The self-calibration circuitry is operable to input at least one predetermined analog value into the converter circuitry and compare the digital output thereof to determine the difference therebetween. The calibration parameters are generated in conjunction with a predetermined compensation algorithm.

In another embodiment of the present invention, the converter comprises a delta-sigma modulator for receiving the analog input value and generating a pulse string having a value proportional thereto. The output of the delta-sigma modulator is filtered by a digital filter to remove extraneous noise therefrom. The compensation circuitry is operable to select either a zero-scale value or a full-scale value. After selecting the zero-scale value, a dc offset value is determined and stored in the memory. The full-scale value is then input to the delta-sigma modulator and the output of the filter measured and offset by said offset value. The offset compensated value is then compared to a predetermined expected result and a gain scale factor determined. The gain scale factor is then stored in the memory. The compensation circuitry is operable to offset the output of the filter by the offset value and then multiply the offset compensated value by the gain scale factor to output a compensated value.

In yet another embodiment of the present invention, the calibration circuitry is inhibited from generating the offset compensated value for a predetermined duration of time after receipt of the zero-scale value and to allow settling of the filter. In a similar manner, measurement of the output of the filter after receipt of the full-scale value is also delayed by the predetermined duration of time to allow settling of the filter. In a self-calibration mode, the zero-scale value is selected with a multiplexer followed by generation of the offset value after the delay. The full-scale value is then selected and then the scale factor is generated after the predetermined delay. The self-calibration operation is initiated in response to an external calibration signal being received.

In a further embodiment of the present invention, a digital signal processor is provided that is controlled to perform the filter operation, the compensation operation and the calibration calculations. The digital signal processor is comprised of multiplication circuitry, addition circuitry and subtraction circuitry and is controlled to first execute a predetermined filter algorithm and then either generate the calibration parameters or utilize the stored calibration parameters to compensate the filter output.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
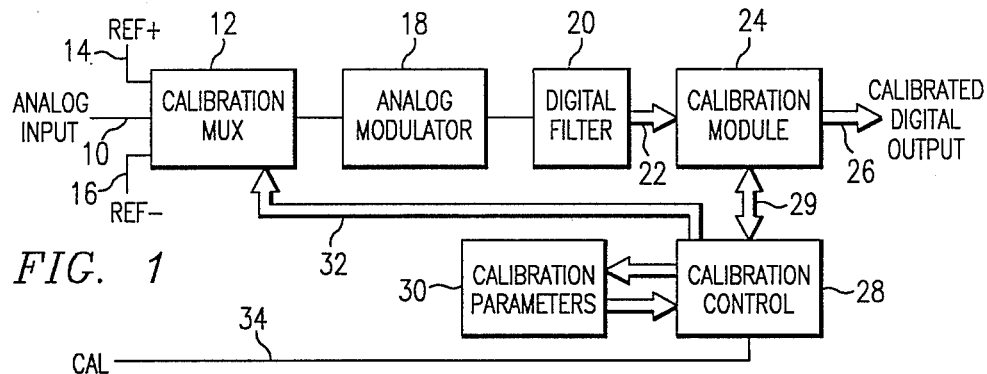
FIG. 1 illustrates a block diagram of the digitally calibrated analog-to-digital converter.

Referring now to FIG. 1, there is illustrated a schematic block diagram of the digitally calibrated analog-to-digital converter of the present invention. An analog input voltage is received on an input line 10 to a calibration multiplexer 12. The calibration multiplexer 12 is operable to receive two other inputs, a full-scale reference input on a terminal 14 and a zero-scale reference input on a terminal 16. For convenience, ground potential is utilized as the zero-scale reference input for the preferred embodiment. The output of the calibration multiplexer 12 is input to an analog modulator 18 that provides on the output thereof a digital signal having a value that is proportional to the value of the analog input voltage. The analog modulator 18, in the preferred embodiment, converts the analog input into an output pulse string having an average amplitude over time proportional to the analog input. Typically, this is realized with a delta-sigma modulator, but it should be understood that other types of modulators can also provide a similar relationship, such as a voltage-to-frequency (V/F) converter. A V/F converter, for example, converts the analog input signal to a frequency and this frequency is then sampled with a counter to provide the digital output.

The analog modulator 18 has a predetermined sample rate which has inherent noise such as quantization noise, associated therewith. This noise is filtered by a digital filter 20 to provide a digital output on a digital data bus 22. The analog modulator 18 and digital filter 20 provide a conventional analog-to-digital converter well-known in the art.

In accordance with the present invention, the output of the digital filter 20 is input to a calibration module 24, the output of which provides a calibrated digital output on an output data bus 26. The calibration module 24 operates on the output of digital filter 22 to provide a correction therefore. In the simplest mode, the calibration module 24 could provide solely a dc offset correction. In the preferred embodiment, both dc offset and gain correction are provided. Conventional delta-sigma modulators of the type utilized for the analog modulator 18 exhibit high linearity. However, it should be understood that the calibration module 24 can also be utilized to compensate for nonlinearities in the output of the analog modulator 18 due to various noise sources, dc drift factors, etc.

The calibration module 24 is controlled by a calibration control circuit 28 which is interfaced therewith through a bus 29. The calibration control circuit 28 interfaces with a memory register 30 for storage of calibration parameters therein, and, in addition, controls the calibration multiplexer 12 through a control bus 32.

In operation, the calibration control circuit 28 is operable in the normal operating mode to access the calibration parameters stored in register 30 and to control the calibration module 24 to provide a correction therefore in accordance with the calibration parameters stored in register 30 and a predetermined compensation algorithm. However, initially, the calibration parameters stored in register 30 are determined by controlling the calibration multiplexer 12 to operate in a calibration mode and first select the zero-scale reference voltage on terminal 16, calculate a first calibration parameter, and then select the full-scale reference voltage terminal 14 and calculate a second calibration parameter. Such operation provides two points of reference by which to compare the actual and uncalibrated output of the digital filter 20. This allows for both offset and gain scaling, as will be described in more detail hereinbelow. The calibration mode is selected by an external calibration signal CAL which is input to the calibration control circuit 28 from the exterior of the analog-to-digital converter through a line 34. Once the calibration signal is received, the analog-to-digital converter automatically generates the calibration parameters for storage in registers 30. As will be described hereinbelow, the system operates either in a self-calibration mode wherein predetermined zero- and full-scale reference values are automatically selected, or in a system calibration mode where the user inputs the reference values. It should be understood that a nonlinear response of the analog-to-digital converter can be corrected by generating additional calibration points as a function of additional input voltages.

Figure 2A:
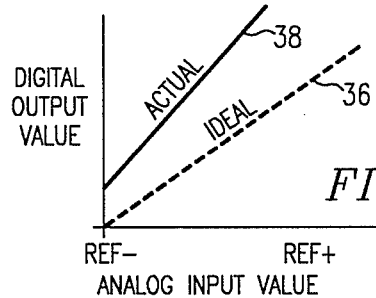
FIGS. 2a-c illustrate the offset and gain correction steps to determine the calibration parameters.
Figure 2B:
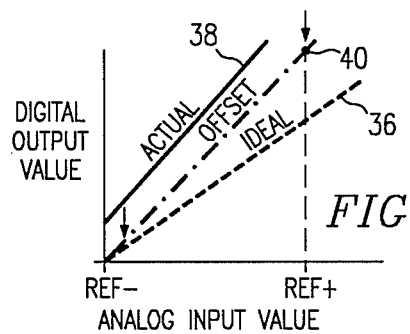
Figure 2C:
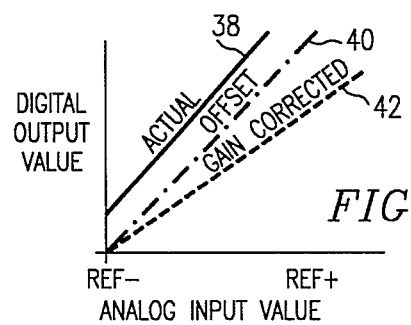

Referring now to FIGS. 2a-2c, there is illustrated an example of the calibration procedure described above. In FIG. 2a, there is represented an ideal curve for the relationship between the analog input value and the digital output value, the curve represented by a dotted line 36. The actual measured and uncorrected value at the output of the digital filter 20 is represented by a solid line 38. It can be seen that the actual measurement has a dc offset and also has a gain variation resulting in a different slope. Initially, the zero-scale reference voltage on terminal 16 is connected to the input of the analog modulator 18 and then the digital filter 20 allowed to settle. The settling operation will be described in more detail hereinbelow. The calibration module 24 is then controlled by the calibration control circuit 28 to measure the output value of the digital filter 20 and calculate the difference between the measured value and the expected value. This is defined as the offset. This offset is then stored in the memory register 30. The correction of this offset results in a solid curve 40 in FIG. 2b, the actual measured value represented by the dotted form of the curve 38.

After the offset correction value has been calculated and stored in the memory register 30, the calibration multiplexer 12 is controlled to connect the full-scale reference voltage on terminal 14 to the input of the analog modulator 18. After the digital filter 20 has settled, the output thereof is offset by the offset value stored in the register 30 and then measured. This enables the calibration module 24 and the calibration control circuit 28 to determine if there is a difference (representing an error) between the expected value of the digital output on the ideal curve 36 and the actual measured value on the offset curve 40 when the analog input value is set to the full-scale reference voltage on terminal 14. If there is a difference, and thus an error, a gain scaling factor is determined by a successive approximation technique, as will be described in more detail hereinbelow. This gain scaling factor is then stored in the memory register 30. Thereafter, calibration parameters are utilized by the calibration control circuit 28 to control the calibration module 24 to correct the output of the digital filter 20 for each operation of the filter. The resulting offset and gain corrected output is represented by a curve 42 which coincides with the ideal curve 36 if the analog modulator 18 and digital filter 20 have perfect linearity. It should be noted that the curves illustrated in FIGS. 2a–2c relate to a uni-polar operation. An alternative bi-polar mode of operation will be described hereinbelow.

Figure 3:
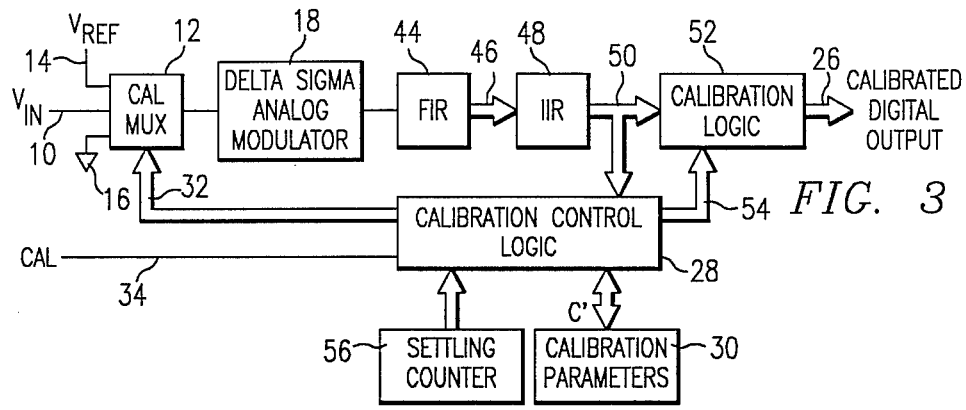
FIG. 3 illustrates a block diagram of the calibrated analog-to-digital converter and the calibration control circuitry utilized to generate the calibration parameters and provide the output calibration.

Referring now to FIG. 3, there is illustrated a more detailed block diagram of the analog-to-digital converter illustrating the use of delta-sigma modulation for the analog modulator 18. The delta-sigma analog modulator 18, as described above, outputs a stream of digital pulses having an average amplitude over time proportional to the analog input signal. This is input to a finite impulse response filter (FIR) 44 that outputs a seven-bit digital word on a bus 46. The FIR 44 provides a decimation function. In the preferred embodiment, the analog modulator 18 is sampled at a 16 kHz rate and the FIR 44 decimates this to a 4 kHz rate. The seven-bit output of FIR 44 on bus 46 is then input to an infinite impulse response filter (IIR) 48 which provides a 28-bit output on a bus 50. The IIR filter 48 provides the major portion of the filtering, although the FIR filter 44 does provide some low-pass filter response, with the IIR filter response 48 being gaussian in nature and providing six poles. As will be described in more detail hereinbelow, the digital filter comprised of the FIR 44 and IIR 48, is done internal to the analog-to-digital converter, and therefore, the digital resolution of the filters can be increased over that on the actual corrected digital output on bus 26, which, in the preferred embodiment, is only sixteen bits.

The 28-bit output bus 50 is input to a calibration logic circuit 52 and also into the calibration control logic circuit 28 to perform both calibration and output correction. The calibration control logic circuit 28 has an output thereof provided to the calibration logic circuit 52 on a bus 54. The calibration control logic circuit 28 also interfaces with a settling counter 56 to determine the amount of time required for the analog-to-digital converter to settle out with respect to the operation of the analog modulator 18, the FIR 44 and IIR 48 whenever the input voltage is disposed at either the full-scale reference voltage on the terminal 14 or the zero-scale reference voltage on the terminal 16. In the block diagram of FIG. 3, the terminal 14 is illustrated as being connected to $V_{REF}$ and the terminal 16 is illustrated as being connected to ground.

The settling counter 56 is operable to provide a predetermined count value that determines the number of operational cycles that are required in order to provide an accurate output after the multiplexer 12 switches to either the full-scale reference terminal 14 or the zero-scale reference terminal 16. In the preferred embodiment, 1024 filter cycles are required before the output has settled. Therefore, an initial 1024 cycles are required in order to calculate the offset, followed by another 1024 cycles to calculate the scale factor, followed by another 1024 cycles to return to normal operation and receive the input voltage $V_{IN}$ on input terminal 10. It is important to note that the entire operation in the self-calibration mode is automatic wherein receipt of the CAL signal on line 34 initiates the self-calibration sequence to calculate and store the dc offset value and then calculate and store the scale factor. This requires three cycles of the settling counter 56.

Figure 4:
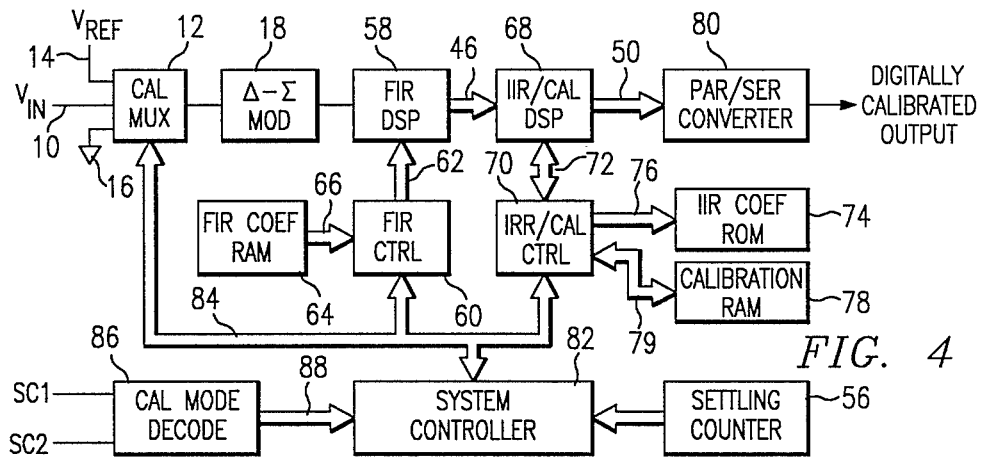
FIG. 4 illustrates a schematic block diagram illustrating the use of the digital signal processor to provide both the digital filtering and the calibration control.

Referring now to FIG. 4, there is illustrated a detailed block diagram of the preferred embodiment of the analog-to-digital converter with digitally calibrated output of the present invention. The FIR filter 44 is comprised of a FIR digital signal processing (DSP) 58 which is interfaced with a FIR controller 60 through a control bus 62. The coefficients for the filter 44 are in a FIR coefficient ROM 64 which is interfaced with the FIR controller 60 through a data bus 66. In the preferred embodiment, the ROM 64 is realized with a programmable logic array.

The FIR DSP is essentially an arithmetic logic unit (ALU), which has the inputs thereof multiplexed to perform the calculations necessary to realize the filter function. Typically, digital filters are comprised of a series of multiplication and addition/subtraction steps which must be executed in a predetermined order, which order is sequential. Therefore, the serial data stream from the modulator 18 is processed through the FIR DSP 58 in accordance with the coefficients stored in the ROM 64. This provides an output on bus 46 which is seven bits wide and at a 4 kHz rate as compared to a 16 kHz rate output by the modulator 18. The FIR DSP 58 under the control of the controller 60 therefore provides decimation of the output of modulator 18 from the 16 kHz rate to the 4 kHz rate.

The IIR filter 48 and the calibration logic circuit 52 are realized with an IIR/CAL digital signal processor (DSP) 68. The IIR/CAL DSP 68 is interfaced with an IIR/CAL controller 70 that is operable to control the operation of the DSP 86. The DSP 68 is interfaced with the controller 70 through a bi-directional data/control bus 72 and the controller 70 is also interfaced with an IIR coefficient ROM 74 through a data bus 76 and with a calibration RAM 78 through a bi-directional data bus 80.

The IIR/CAL DSP 86 is essentially an arithmetic logic unit that has the inputs thereof multiplexed to provide a sequence of multiplication and addition/subtraction operations in accordance with the IIR algorithm. After the filter function of the IIR filter is complete, the results are then utilized to perform the calibration function or correction function with the same arithmetic logic unit. Therefore, a single arithmetic logic unit provides the filter function the calibration function and the output correction function. During processing of the data through the IIR algorithm, the coefficients stored in ROM 74 are utilized and, during the correction function, wherein the output is corrected for offset and gain, the contents of the calibration RAM 78 are fetched. During generation of the calibration parameters in the calibration mode and subsequent storage in the calibration RAM 78, the DSP 68 is controlled to calculate the calibration parameters after filtering is complete.

The output of the IIR/CAL DSP 68 is input to a parallel-to-serial converter 80 that is operable to convert the twenty-eight bit output of the IIR/CAL DSP 68 into a sixteen-bit serial data string. As described above, it is important to note that the filtering function, the calibration function and the output correction function are performed at a twenty-eight bit resolution, whereas the output only provides a sixteen-bit resolution.

A system controller 82 is provided, which is interfaced through a control bus 84 to the calibration multiplexer 12, the FIR controller 60 and the IIR/CAL controller 70. The microcontrol code stored in the system controller 82 therefore controls the operation of the analog-to-digital converter in normal operation to provide a corrected output and also controls the system to generate during calibration the various calibration parameters for storage in the calibration RAM 78.

The system controller 82 is interfaced with a calibration mode decode circuit 86 that is interfaced with two pins SCI and SC2. This provides a two-bit input to the decode circuit, which decoded output is interfaced with the system controller 82 through a four-bit bus 88. The inputs SCI and SC2 are operable to generate a number of different calibration modes. In a first calibration mode, the system controller 82 is operable to perform a self-calibration wherein zero-scale is determined by selecting the ground voltage on the zero-scale reference terminal 16 and full-scale is determined by selecting the $V_{REF}$ voltage on the full scale reference terminal 14. A second mode is provided through use of the pins SCI and SC2 to provide a system calibration function. In the system calibration function, a customer is allowed to input the zero-scale and full-scale values for use in generating the calibration parameters for storage in the calibration RAM 78. This feature allows the customer to input the zero-scale or full-scale values to account for various system offsets that may be different from ground and $V_{REF}$.

In operation with the system calibration feature, one of the pins SCI or SC2 is raised high with the other remaining low. This indicates to the system controller 82 that it is to select a value on the $V_{IN}$ terminal 10 as the zero-scale reference for calculating the dc offset value for storage in the calibration RAM 78. The system controller 82 then waits for the other of pins SCI and SC2 to be raised high, indicating input of the full-scale value on the $V_{IN}$ terminal 10. The system controller 82 then selects the voltage on the $V_{IN}$ terminal 10 for use in calculating the dc offset value. This dc offset value is then stored in the calibration RAM 78. This is distinguished from the self-calibration mode in that the multiplexer 12 always selects the $V_{IN}$ terminal 10, and the customer determines the analog values that are input as full-scale and zero-scale values. Also, the controller 70 and DSP 68 do not process the next value until it receives an indication from the decode circuit 86 that a new value is being input as the full-scale value. However, the settling counter 56 is still operable to provide the settling time of the analog modulator 18 and the filters 44 and 48, and the system controller 82 waits for counter 56 to cycle prior to performing any of the calculations.

Figure 5:
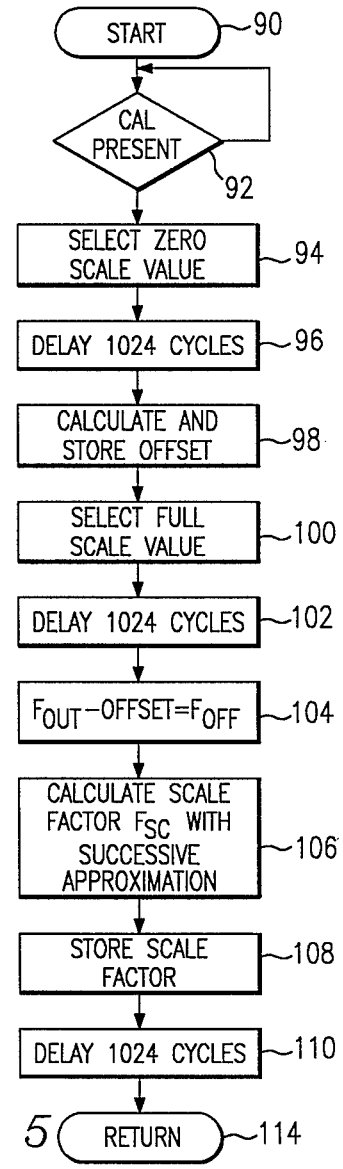
FIG. 5 illustrates a flow chart for self calibration procedure.

Referring now to FIG. 5, there is illustrated a flow chart for the self-calibration operation. The calculation is initiated at start block 90 and then flows to a decision block 92 to determine if the calibration signal is present. If it is present, the program flows along a "Y" path and, if it is not present, the program flows back to the input of decision block 92 along an "N" path. When the CAL signal is present, the zero-scale value is selected in a function block 94. It should be noted that the same process is applicable for the system calibration function wherein the zero-scale value is input on the analog input terminal 10. For self-calibration, selection of the zero-scale value requires selection of the zero-scale reference terminal 16.

After selection of the zero-scale value, the program flows to a function block 96 to provide a delay of 1024 cycles, then the program flows to the function block 98 to calculate and store the dc offset value. After storing the dc offset value, the full-scale value is selected, as indicated in a function block 100. In the system calibration mode, the full scale value is not selected until the decode circuit 86 has indicated that it is present on the $V_{IN}$ terminal 10. The full-scale value is selected from the $V_{REF}$ terminal 14 in the self-vibration mode. A delay of 1024 cycles is then provided by function block 102 and then the program flows to a function block 104 to measure the output of the filter and subtract the dc offset value therefrom to provide the offset compensated output of the filter $F_{OFF}$. The program then flows to a function block 106 to calculate the scale factor with a successive approximation technique. However, it should be understood that other techniques can be utilized. For example, the reciprocal of $F_{OFF}$ can be calculated.

When calculating the scale factor with a successive approximation technique, an initial scale factor is utilized for multiplication with $F_{OFF}$, which initial scale factor is midway between maximum and minimum. Each bit is then successively tested, and if the output is too high, that bit is reset until all the bits are tested. Successive approximation techniques are well-known in the art.

Once the scale factor has been determined by the successive approximation technique, the scale factor is stored in calibration RAM 78, as indicated by a function block 108. The program then flows to a block 110 indicating a delay of 1024 cycles and then to return block 114 to allow the system to return to normal operation.

Figure 6:
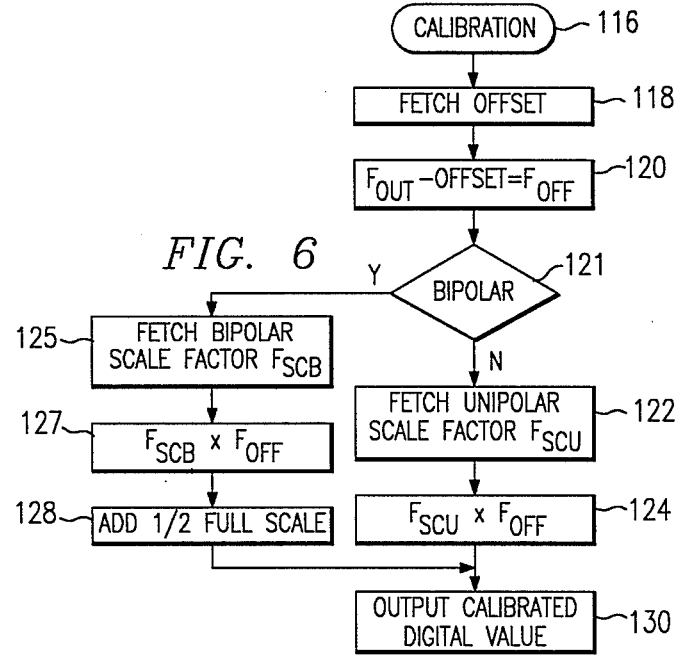
FIG. 6 illustrates a flow chart for the output calibration.

Referring now to FIG. 6, there is illustrated a flow chart for the output correction procedure after storage of the calibration parameters in the calibration RAM 78. The program is initiated at a start block 116 and then flows to a block 118 to fetch the dc offset value from the calibration RAM 78. The value of $F_{OFF}$ is then calculated by subtracting the dc offset value from the output of the filter $F_{OUT}$. This is indicated in a function block 120. After calculation of $F_{OFF}$, a determination as to whether the analog-to-digital converter is operating in a uni-polar mode or a bi-polar mode is made by a decision block 121. This is determined by a single digital input signal on an external pin. If it is uni-polar, the program flows along the "N" path. The scale factor is then fetched from the calibration RAM 78, as indicated by function block 122, and then the program flows to function block 124 to calculate the product of the uni-polar scale factor and the offset output of the filter $F_{OFF}$. The uni-polar and bi-polar modes each have a different scale factor.

If the system is bi-polar, the program flows along the "Y" path from the decision block 121. In the bi-polar mode, the system typically operates over a range from $-V_{REF}$ to $+V_{REF}$. However, the calibration is performed only from zero-scale to $+V_{REF}$. The delta-sigma analog modulator 18 operates in an identical manner whether it is in the bi-polar or uni-polar mode. Therefore, after calculation, the digital value must be increased by one half of full scale to provide an accurate output. The bi-polar scale factor is fetched, as indicated by a function block 125, and the product of the bi-polar scale factor and $F_{OFF}$ is determined, as indicated by a function block 127. The result is increased by one half-scale, as indicated by a function block 128. It should be noted that if the calibration were performed over a $-V_{REF}$ to a $+V_{REF}$ range, this increase in scale would not be required.

After adding the value of one half full-scale with a bi-polar operation or determining that it is a unipolar operation, the program flows to a function block 130 to output the corrected digital value from the DSP 68 to the parallel-to-serial converter 80.

In summary, there has been provided an analog-to-digital converter with a self-calibration mode to provide a corrected output. In the self-calibration mode, calibration parameters are determined to both account for offset and for gain errors. These parameters are stored and utilized in normal operation to provide both the offset and gain compensation prior to outputting the digital value.

Although the preferred embodiment has been described in detail, it should be understood that various changes, substitutions and alterations can be made therein without departing from the spirit and scope of the invention as defined by the appended claims.

What is claimed is:

1. A self-calibrating analog-to-digital converter, comprising:
   an oversampled analog modulator for receiving said analog input signal and outputting a digital signal that is proportional to said analog input signal;
   a digital filter for filtering out noise on the digital output of said analog modulator;
   storage means for a storing digital calibration parameters;
   output compensation means for compensating the digital output of said digital filter in accordance with a predetermined compensation algorithm that is a function of said digital calibration parameters; and
   calibration means for generating said calibration parameter for storing in said storage means in response to a calibration control signal, said calibration means including:
   means for inputting at least one predetermined analog value to the input of said oversampled analog modulator,
   means for comparing the digital value output by said digital filter to a predetermined expected value when said one predetermined analog value is input thereto and determining if there is a difference therebetween, and
   generating said calibration parameters such that said generated calibration parameters are used in conjunction with said predetermined compensation algorithm will result in a predetermined digital value being output from said output compensation means when an analog input signal equal to said one predetermined analog value is input to said oversampled analog modulator.

2. The analog-to-digital converter of claim 1 wherein said analog modulator comprises a delta-sigma modulator.

3. The analog-to-digital converter of claim 1 wherein said output compensation means comprises offset compensation circuitry for offsetting the digital output value of said digital filter by a predetermined offset, said predetermined offset comprising said digital calibration parameter.

4. The analog-to-digital converter of claim 1 wherein said output compensation means comprises gain correction circuitry for multiplying the digital output of said digital filter by a predetermined gain scaling factor, said predetermined gain scaling factor comprising said digital calibration parameter.

5. The analog-to-digital converter of claim 1 wherein said calibration control signal is externally generated.

6. The analog-to-digital converter of claim 1 wherein said the combination of said analog modulator and said digital filter has a finite response time and wherein said calibration means further comprises means for inhibiting said means for comparing from operating until a predetermined duration of time has elapsed to allow the digital output of said digital filter to settle after said predetermined analog value is input thereto.

7. The analog-to-digital converter of claim 1 wherein said means for inputting comprises a multiplexer having one input thereof for receiving the analog input signal and the other input thereof for receiving said one predetermined analog value, said one predetermined analog value selected in response to said calibration means receiving said calibration control signal.

8. A self-calibrating analog-to-digital converter, comprising:
   an oversampled analog modulator for receiving said analog input signal and outputting a digital signal that is proportional to said analog input signal;
   a digital filter for filtering out noise on the digital output of said analog modulator;
   storage means for storing a plurality of digital calibration parameters;
   output compensation means for compensating the digital output of said digital filter in accordance with a predetermined compensation algorithm that is a function of said digital calibration parameters; and
   calibration means for generating said calibration parameters for storing in said storage means in response to receiving an external calibration control signal, said calibration means including:
   means of inputting a predetermined analog value into said oversampled analog modulator,
   means for comparing the digital value output by said digitial filter to at least one of a plurality of predetermined expected values when said predetermined analog values are input thereto and determining if there is a difference therebetween, and means for generating said calibration parameters such that said generated calibration parameters in conjunction with said predetermined compensation algorithm will result in a predetermined digital value being output from said output compensation means when an analog input signal equal to said one predetermined analog value is input to said oversampled analog modulator.

9. The analog-to-digital converter of claim 8 wherein said output compensation means comprises:

offset circuitry for offsetting the digital value output by said digital filter by a predetermined offset value; and gain correction circuitry for multiplying the digital output of said digital filter after offsetting by said offset circuitry by a predetermined gain scaling factor;

said digital calibration parameters comprised of said offset value and said predetermined gain scaling factor.

10. A self-calibrating analog-to-digital converter, comprising:

an oversampled analog modulator for receiving said analog input signal and outputting a digital signal that is proportional to said analog input signal;

a digital filter of filtering out noise on the digital output of said analog modulator;

storage means for storing digital calibration parameters containing a dc offset value and a gain scaling factor;

output compensation means operable in a normal compensation mode for digitally compensating the digital output of said digital filter for dc offset and gain compensation in accordance with a predetermined compensation algorithm that is a function of said digital calibration parameters stored in said storage means; and calibration means operable in a calibration mode to receive the digital output of said digital filter in response to first and second predetermined analog input values being sequentially input to said oversampled analog modulator to provide on the output of said digital filter first and second measured output values, respectively, said calibration means operable to compare said first and second measured values to expected first and second values, respectively, and calculate said dc offset value and said gain scaling factor, said dc offset and said gain scaling factor stored at the storage means as said digital calibration parameters.

11. The analog-to-digital converter of claim 10 and further comprising means for operating the analog-to-digital converter in said calibration mode in response to an external signal wherein said output compensation means is prohibited from operating in the compensation mode.

12. The analog-to-digital converter of claim 10 wherein said oversampled analog modulator comprises:

a delta-sigma analog modulator for outputting a string of digital pulses; and said digital filter for filtering noise out of said string of digital pulses and outputting a digital value therefrom.

13. The analog-to-digital converter of claim 10 wherein said output compensation means comprises:

means for offsetting by said dc offset value the digital value output by said digital filter to provide an offset compensated value; and means for multiplying said offset compensated value by said gain scaling factor.

14. The analog-to-digital converter of claim 10 wherein said first predetermined analog input value comprises a zero-scale value and said second predetermined analog input value comprises a full-scale value, wherein said calibration means is operable to calculate said dc offset value utilizing said zero-scale value and said calibration means is operable to calculate said gain scale factor by utilizing said calculated dc offset value and said full-scale value.

15. The analog-to-digital converter of claim 14 wherein said calibration means comprises:

means for receiving the output of said digital filter;

multiplexer means for selecting between an analog input, said full-scale value, and said zero-scale value;

offset means for comparing said measured output value from said digital filter with said first expected value and determining the difference therebetween when said zero-scale value is selected by said multiplexer means, said offset means calculating said dc offset value to provide compensation for the difference;

gain scaling means for subtracting said calculated dc offset value from said measured output value when said full-scale value is selected by said multiplexing means to provide an offset compensated value and comparing said offset compensated value with said second expected value to determine the difference therebetween and calculating said gain scaling factor to provide compensation for the difference; and storing said offset and said gain scale factor in said storage means.

16. The analog-to-digital converter of claim 15 wherein the combination of said analog modulator and said digital filter has a finite response time and further comprising:

means for delaying operation of said offset means by a predetermined delay time after said zero-scale value is selected by said multiplexer means; and means for delaying said gain scaling means for said predetermined delay time after selection of said full-scale value by said multiplexing means, said predetermined duration of time providing sufficient time for said digital filter to settle.

17. The analog-to-digital converter of claim 15 wherein said output compensation means comprises:

means for accessing said storage means to fetch said dc offset value and said gain scaling factor therefrom;

means for subtracting said dc offset value from the digital value output by said conversion means to provide an offset compensated value; and means for multiplying said offset compensated value by said gain scaling factor to provide an output compensated value, said output compensated value output from the analog-to-digital converter.

18. The analog-to-digital converter of claim 10 wherein the compensated digital value output by said output compensation means comprises a digital value having a first resolution and further comprising means for digitally truncating the number of bits in the compensated digital value output by said compensation means to decrease the resolution thereof for output from the analog-to-digital converter such that said output compensation means and said conversion means operate on a higher resolution than the digital value output by the analog-to-digital converter.

19. The analog-to-digital converter of claim 10 wherein the combination of said oversampled analog modulator and said digital filter has a substantially linear response.

20. The analog-to-digital converter of claim 10 wherein said calibration means comprises:
first receiving means for receiving the output of said digital filter after a first predetermined delay in response to receiving a first external control signal, said first external control signal indicating the presence of said first predetermined analog value on the input of said oversampled analog modulator;
offset means for comparing said receiving output received by said first receiving means with said first expected value and calculating said dc offset value;
second receiving means for receiving the output of said digital filter after a second predetermined delay in response to receiving a second external control signal, said second external control signal indicating the presence of said second predetermined analog value on the input of said oversampled analog modulator;
gain scaling means for substracting said dc offset value from said received output from said receiving means to provide an offset compensated value and comparing said offset compensated value with said second expected value to determine the difference therebetween and calculating said gain scaling factor to provide compensation for the difference; and
storing said calculated dc offset value and said calculated gain scaling factor in said storage means.

21. The analog-to-digital converter of claim 20 wherein said digital signal processor has a predetermined digital resolution and further comprising means for truncating the output of said compensation means by a predetermined value such that the output therefrom has a lower resolution than said digital signal processor wherein said digital signal processor operates at a higher resolution than the resolution of the value output by said truncating means.

22. A self-calibrating analog-to-digital converter, comprising:
an oversampled analog modulator for receiving an analog input signal and converting it to a digital output having a value proportional to said analog input signal;
a digital signal processor for receiving the output of said analog modulator and operable to perform multiplication, addition and/or subtraction thereon in accordance with predetermined processing algorithms;
filter means for controlling said digital signal processor to execute a predetermined filter algorithm to filter the output of said oversampled analog modulator in the digital domain and output a digital value;
mode control means to operate the analog-to-digital converter in a normal mode or in a calibration model;
storage means for storing calibration parameters;
compensation means operable in the normal mode for controlling said digital signal processor to compensate the digital output value generated by said digital signal processor after execution of said filter algorithm in accordance with a predetermined compensation algorithm utilizing said calibration parameters;
input means operable in said calibration mode for inputting predetermined analog calibration signals into said oversampled analog modulator and operable in the normal mode to input said analog signal to said oversampled analog modulator; and
calibration means operable in the calibration mode for controlling said digital signal processor to compare the output of said digital signal processor with predetermined expected values after receipt of said predetermined analog calibration signals by said oversampled analog modulator and execution of said filter function thereon and calculate said calibration parameters in accordance with a predetermined calibration algorithm.

23. The analog-to-digital converter of claim 22 wherein said analog modulator oversampled comprises a delta-sigma modulator.

24. The analog-to-digital converter of claim 22 wherein said compensation algorithm comprises:
means for determining a dc offset value and a gain scaling factor after comparison of the output of said digital signal processor with said predetermined expected values, said dc offset value and said gain scaling factor comprising said calibration parameters; and
said compensation algorithm comprises an offset of the measured value output by said digital signal processor after execution of said filter algorithm by said dc offset value to provide an offset compensated value followed by a multiplication of said offset compensated value by said gain scaling factor to provide a compensated output.

25. The analog-to-digital converter of claim 24 wherein said predetermined analog inputs comprise a zero-scale value and a full-scale value and said calibration means comprises:
means for controlling said digital signal processor to compare the results of said filter algorithm with a first expected result after receipt by said analog modulator of said zero-scale value and determine the difference therebetween, said difference constituting said dc offset value;
means for controlling said digital signal processor to subtract said offset value from the result of said filter algorithm to provide an offset value compensated after receipt by said analog modulator of said full-scale value, said digital signal processor controlled to compare said offset compensated value with a second expected result and calculate said gain scaling factor from the difference therebetween; and
means for storing said dc offset value and said gain scaling factor in said storage means.

26. The analog-to-digital converter of claim 25 and further comprising delay means for inhibiting said calibration means from calculating said dc offset value for a predetermined delay after receipt of said zero-scale value, and inhibiting calculation of said offset compensated value for said predetermined duration of time after receipt of said full-scale value to allow said analog modulator oversampled and said digital signal processor to settle, said analog modulator oversampled and said digital signal processor having a finite response time.

27. The analog-to-digital converter of claim 25 wherein said input means comprises a multiplexer having an input thereof connected to said zero-scale value, an input thereof connected to said full-scale value and an input thereof connected to said analog input signal, said multiplexer operable in the normal mode to select said analog input signal and in the calibration mode to select either said full-scale value or said zero-scale value in accordance with said calibration algorithm.

28. A method for converting an analog input to a compensated digital output with internal calibration, comprising:
   providing an oversampled analog modulator;
   receiving an analog input signal on the input to the oversampled analog modulator and filtering the output of the oversampled analog modulator with a digital filter to an uncompensated digital output having a digital value proportional to the analog input signal;
   storing digital calibration parameters containing a dc offset value and a gain scaling factor;
   operating in either a normal compensation mode or a calibration mode;
   digitally compensating the uncompensated digital output in the normal compensation mode to provide the compensated digital output with dc offset and gain compensation in accordance with a predetermined compensation algorithm that is a function of the stored digital calibration parameters;
   generating the calibration parameters by receiving the uncompensated digital output when in the calibration mode in response to first and second predetermined analog input values being sequentially input as the analog input signal to provide on the uncalibrated digital output first and second output values, respectively;
   comparing the first and second output values to expected first and second values, respectively; and
   calculating the dc offset value and the gain scaling factor for storage as the digital calibration parameters.

29. The method of claim 28 wherein the step of converting the analog input signal to an uncompensated digital output signal comprises inputting the analog input signal to a delta-sigma analog modulator and filtering the output thereof with a digital filter.

30. The method of claim 28 wherein the step of compensating the output comprises:
   offsetting the uncompensated digital output by the offset value to provide an offset compensated value; and
   multiplying the offset compensated value by the gain scaling factor.

31. The method of claim 28 wherein the first predetermined analog input value comprises a zero-scale value and the second predetermined analog input value comprises a full-scale value, wherein the step of generating the calibration parameters comprises calculating the dc offset value utilizing the zero-scale value and then calculating the gain scaling factor by utilizing the calculated dc offset value and the full-scale value.

32. The method of claim 28 wherein the step of calculating the dc offset value and calculating of the gain scaling factor comprises delaying calculation of the dc offset value and the gain scaling factor for a predetermined amount of time after input of each of the first and second predetermined analog input values.

33. The method of claim 28 wherein the step of compensating the output comprises:
   accessing the stored dc offset value and the gain scaling factor;
   subtracting the dc offset value from the uncompensated digital output to provide an offset compensated value; and
   multiplying the offset compensated value by the gain scaling factor to provide an output compensation value.

34. The method of claim 28 wherein the compensated digital value comprises a digital value having a first resolution and further comprising truncating the number of bits in the compensated digital value to decrease the resolution thereof such that the step of compensation and the step of calibration is carried out at a higher resolution than the resolution of the actual output compensated value.

* * * * *